United States Patent [19]

Ishii

[11] Patent Number: 5,579,293

[45] Date of Patent: Nov. 26, 1996

[54] MAGNETIC HEAD DRIVING CIRCUIT FOR CONTROLLING SWITCHING OPERATIONS IN A MAGNETOOPTICAL RECORDING APPARATUS

[75] Inventor: Kazuyoshi Ishii, Tokyo, Japan

[73] Assignee: Canon Kabushiki Kaisha, Tokyo, Japan

[21] Appl. No.: 476,043

[22] Filed: Jun. 7, 1995

Related U.S. Application Data

[63] Continuation of Ser. No. 217,104, Mar. 24, 1994, abandoned.

[30] Foreign Application Priority Data

Mar. 26, 1993 [JP] Japan ................................ 5-090483
Mar. 10, 1994 [JP] Japan ................................ 6-039638

[51] Int. Cl.⁶ .................................................. G11B 11/00
[52] U.S. Cl. .............................................. 369/13; 360/114
[58] Field of Search ........................ 369/13, 14; 360/114, 360/46, 66, 123, 59

[56] References Cited

U.S. PATENT DOCUMENTS

| | | | |
|---|---|---|---|
| 4,937,470 | 6/1990 | Zeiler | 307/270 |
| 4,937,802 | 6/1990 | Omori et al. | 369/13 |
| 5,126,588 | 6/1992 | Reichmeyer et al. | 307/270 |
| 5,157,641 | 10/1992 | Lehureau | 369/13 |
| 5,278,809 | 1/1994 | Ogata | 369/13 |
| 5,307,329 | 4/1994 | Shibuya et al. | 369/13 |

FOREIGN PATENT DOCUMENTS

| | | | |
|---|---|---|---|
| 0312413 | 4/1989 | European Pat. Off. . | |
| 312143 | 4/1989 | European Pat. Off. | 369/13 |
| 2647940 | 12/1990 | European Pat. Off. . | |
| 559469 | 9/1993 | European Pat. Off. | 369/13 |
| 63-94406 | 4/1988 | Japan . | |
| 63-244402 | 10/1988 | Japan . | |
| 01-130302 | 5/1989 | Japan . | |
| 3157839 | 7/1991 | Japan | 369/13 |
| 3276404 | 12/1991 | Japan | 369/13 |
| 05-128402 | 5/1993 | Japan . | |

OTHER PUBLICATIONS

Patent Abstracts of Japan, Kokai No. 4-212702, vol. 16, No. 555, Nov. 1992.
Patent Abstracts of Japan, Kokai No. 3-272038, vol. 16, No. 89, Mar. 1992.
Patent Abstracts of Japan, Kokai No. 1-224902, vol. 13, No. 543, Sep. 1989.

*Primary Examiner*—Tan Dinh
*Attorney, Agent, or Firm*—Fitzpatrick, Cella, Harper & Scinto

[57] ABSTRACT

A magnetic head driving apparatus is provided with a pair of switch elements for switching a direction of a current to be supplied to a magnetic head. ON/OFF operations of the pair of switch elements are controlled in correspondence with an information signal to be recorded so as to modulate a magnetic field generated by the magnetic head in accordance with the information signal. A predetermined time difference is provided between an ON operation of one switch element and an OFF operation of the other switch element of the pair of switch elements.

19 Claims, 9 Drawing Sheets

FIG. 8A  GATE DRIVING SIGNAL S1, S2

FIG. 8B  GATE DRIVING SIGNAL S3, S4

FIG. 8C  DRIVING CURRENT OF MAIN COIL

MAGNETIC HEAD DRIVING CIRCUIT FOR CONTROLLING SWITCHING OPERATIONS IN A MAGNETOOPTICAL RECORDING APPARATUS

This application is a continuation of prior application, Ser. No. 08/217,104 filed Mar. 24, 1994, now abandoned.

BACKGROUND OF THE INVENTION

1. Field of the Invention

The present invention relates to a driving apparatus for a magnetic field modulation magnetic head used in a magnetooptical recording apparatus adopting a magnetic field modulation method.

2. Related Background Art

Figure 1:
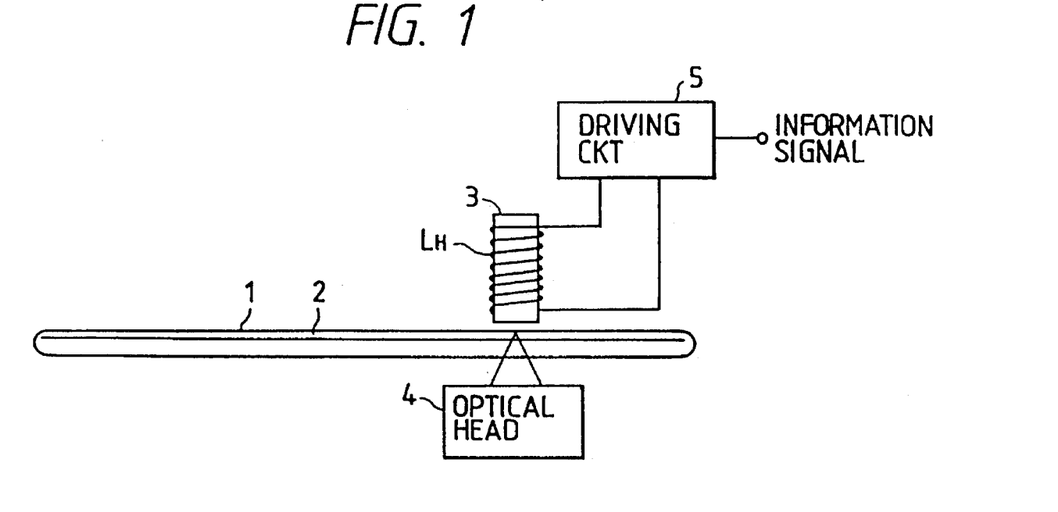
FIG. 1 is a schematic diagram showing the arrangement of a magnetooptical recording apparatus adopting a magnetic field modulation method.

As a conventional recording method of a magnetooptical recording apparatus, an optical modulation method, a magnetic field modulation method, and the like are known. In particular, the magnetic field modulation method is advantageous in terms of the recording speed, and the like since it can directly overwrite new data on old data. FIG. 1 shows the schematic arrangement of a magnetooptical recording apparatus adopting the magnetic field modulation method. Referring to FIG. 1, a magnetooptical recording layer 2 is formed on a magnetooptical disk 1. A magnetic head 3 obtained by winding a main coil $L_H$ around a magnetic core is arranged above the upper surface of the magnetooptical disk 1, and an optical head 4 is arranged below the lower surface thereof to oppose the magnetic head 3. The optical head 4 radiates a laser beam emitted from a semiconductor laser arranged therein as a light source as a very small beam spot on the recording layer 2 to increase the temperature of a recording portion to a temperature equal to or higher than the Curie temperature of the recording layer 2. The magnetic head 3 is driven by a driving circuit 5 to generate a bias magnetic field which is modulated according to recording information, and applies the bias magnetic field to the heated portion of the recording layer 2. Then, the direction of magnetization of the heated portion on the recording layer 2 aligns in the direction of the bias magnetic field. When the heated portion is cooled down upon rotation of the magnetooptical disk 1, the direction of magnetization is fixed, and an information pit in the direction of magnetization corresponding to an information signal is recorded on the recording layer 2.

Recently, in order to record information at a higher density, an information pit recording method is changing from pit position recording which provides the significance of information at the central position of a pit to pit edge recording which provides the significance of information to the edge position of a pit. In this pit edge recording, the edge of an information pit must be clearly recorded, and for this purpose, it is required to achieve a high reversal speed of the bias magnetic field by the magnetic head in recording.

Figure 2:
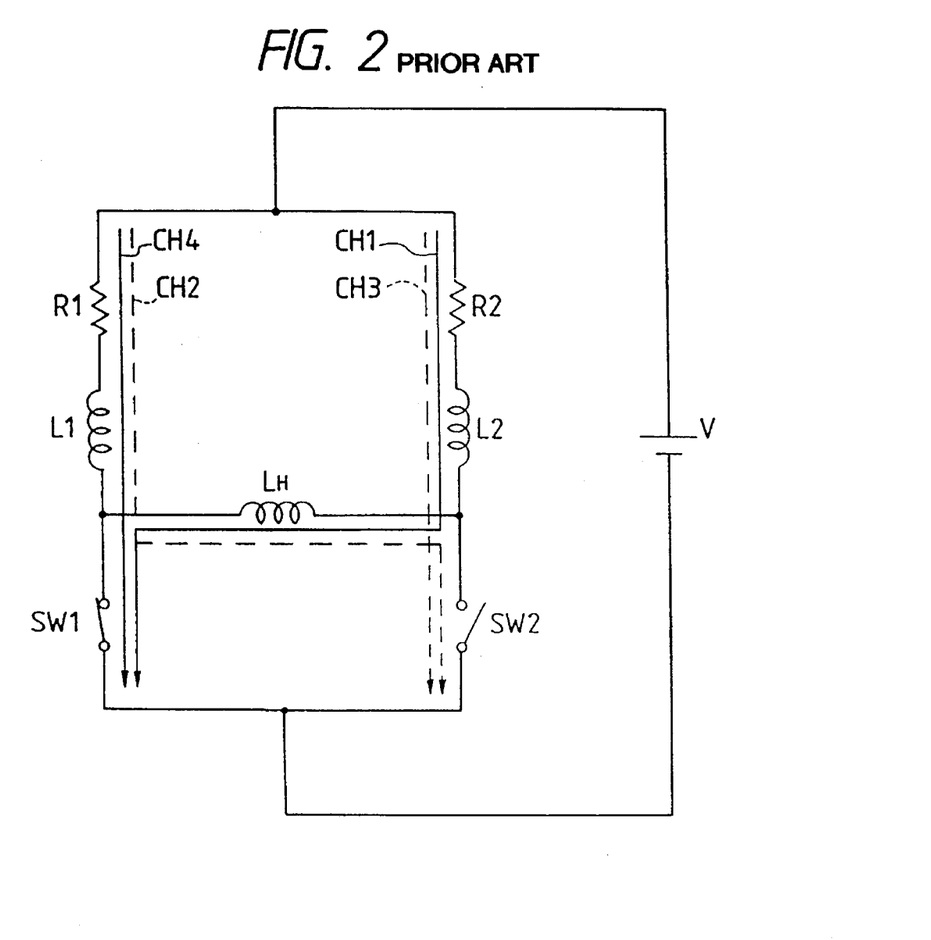
FIG. 2 is a circuit diagram showing a conventional magnetic head driving apparatus.

As a first example of a driving apparatus of the magnetic head, which can satisfy such a requirement, an apparatus disclosed in, e.g., Japanese Laid-Open Patent Application No. 63-94406 is known. FIG. 2 is a circuit diagram showing the driving apparatus. The apparatus comprises a main coil $L_H$ for generating a bias magnetic field for the magnetic head 3, auxiliary coils L1 and L2 for switching a magnetic field at high speed, switch elements SW1 and SW2 for switching the direction of a current to be supplied to the main coil $L_H$, and current limiting resistors R1 and R2. The inductances of the auxiliary coils L1 and L2 are set to be sufficiently larger than that of the main coil $L_H$. In this driving apparatus, the switch elements SW1 and SW2 are controlled in accordance with recording information to be alternately turned on, so as to switch the direction of a current to be supplied to the main coil $L_H$, thereby switching the polarity of the generated magnetic field in accordance with recording information.

More specifically, when the switch element SW1 is ON, and the switch element SW2 is OFF, current paths CH1 and CH4 are enabled, and current paths CH2 and CH3 indicated by dotted lines are disabled. At this time, since a current is supplied to the main coil $L_H$ via the enabled current path CH1, a magnetic field corresponding to the direction of the supplied current is generated by the coil $L_H$. On the other hand, when the switch element SW1 is OFF and the switch element SW2 is ON, the current paths CH2 and CH3 are enabled, and the current channels CH1 and CH4 are disabled. As a result, a current in a direction opposite to the above-mentioned current is supplied to the main coil $L_H$ via the enabled current path CH2, and the coil $L_H$ generates a magnetic field having an inverted polarity. Since the inductances of the auxiliary coils L1 and L2 are sufficiently larger than that of the main coil $L_H$, currents flowing through the auxiliary coils L1 and L2 are substantially constant irrespective of the disabled or enabled state of the current paths. For this reason, when the ON/OFF times of the switch elements SW1 and SW2 are set to be sufficiently short, the direction of a current flowing through the main coil $L_H$ can be reversed in a very short time, and the bias magnetic field generated by the magnetic head can be reversed at high speed.

Figure 11:
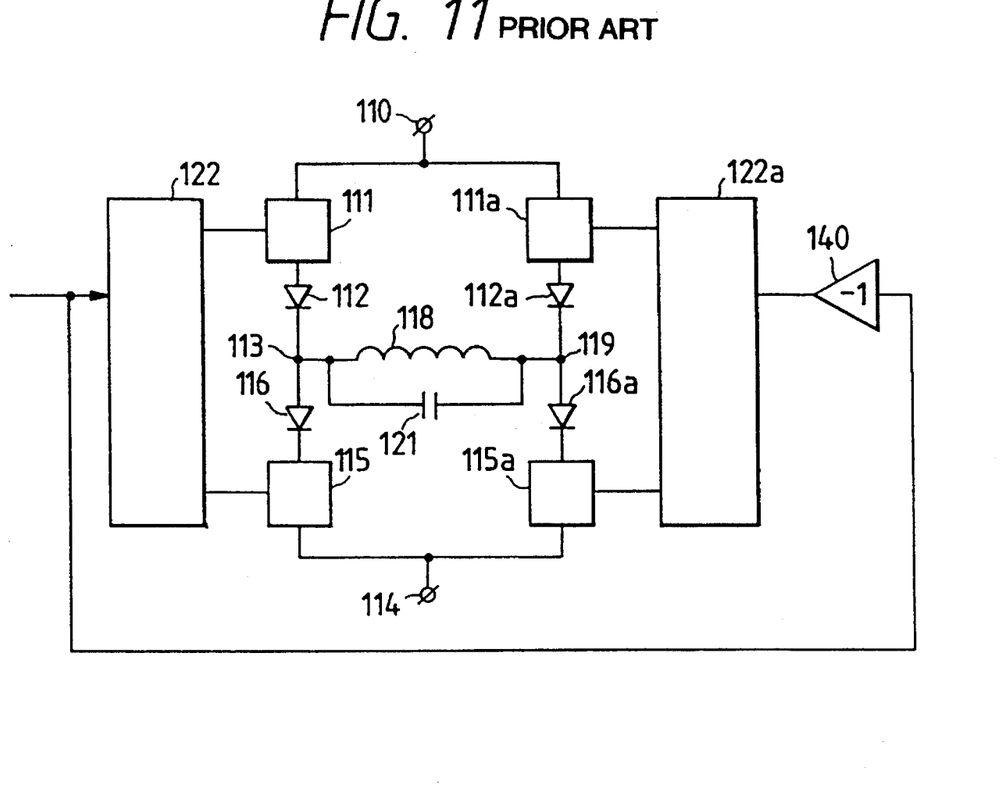
FIG. 11 is a circuit diagram showing a second conventional apparatus.

Furthermore, in published European Patent Application No. 312143 (Japanese Laid-Open Patent Application No. 1-130302), a driving apparatus shown in FIG. 11 is known as a second conventional apparatus. Referring to FIG. 11, the driving apparatus comprises switch elements 111, 111a, 115, and 115a, diodes 112, 112a, 116, and 116a, a magnetic head coil 118, a capacitor 121, and driving circuits 122 and 122a for switch elements. Terminals 110 and 114 are connected to a power supply. The magnetic head coil 118 and the capacitor 121 constitute a parallel resonance circuit. In this driving apparatus, after one of the current paths to the magnetic head coil 118 is disabled, the other of the current paths is disabled over a period corresponding to ½ of the resonance period of the resonance circuit. Therefore, a power supply with a low voltage can be used, so that the dissipation power of the circuit is reduced.

However, such a driving apparatus which utilizes the resonance between a magnetic head and a capacitor to reverse a current has a disadvantage in that it is difficult to drive the apparatus at a high frequency because the resonance circuit has a loss (resistance).

Figure 12:
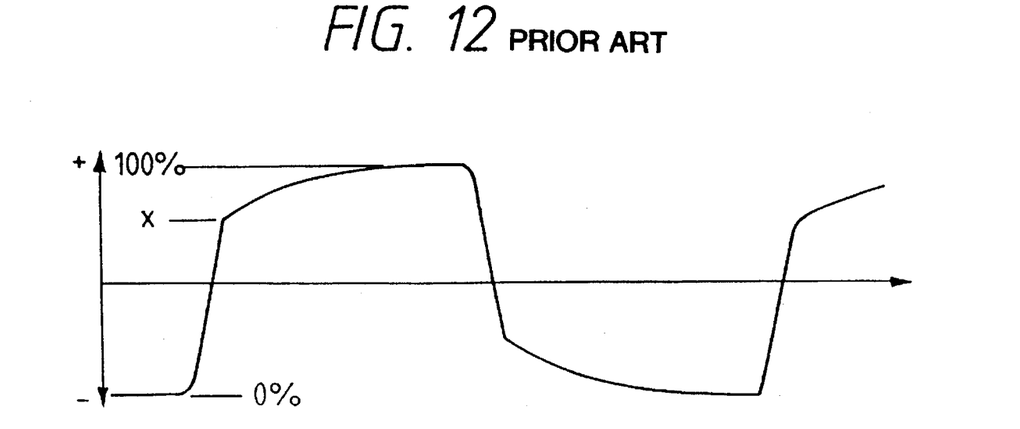
FIG. 12 is a view showing a waveform in the second conventional apparatus.

This will now be described in more detail. FIG. 12 shows the waveform of a current supplied to the magnetic head coil of the conventional apparatus shown in FIG. 11. The amplitude of a predetermined current is defined as 100%. In current reversal utilizing a resonance, the maximal value X of the reversed current is smaller than 100% due to the above-mentioned loss, and normally within the range of 60% to 80%. After exceeding the maximal value, the magnetic head coil is connected to a power supply with a low voltage, so that a current gradually increases to reach a predetermined value. Due to a short in a current upon reversal, when a driving frequency is set high, a sufficient amplitude of the current cannot be obtained.

Still further, although a current is reversed with a resonance at a high speed, a current then changes slowly and it takes a long time to obtain a predetermined current value. Therefore, this driving apparatus is not suitable for pit edge recording.

In contrast, according to the above-mentioned first conventional apparatus, since the auxiliary coil with a sufficiently large inductance has a constant current property, the apparatus not only comprises characteristics that the apparatus can operate by a power supply with a low voltage, as in the second conventional apparatus, but also can be driven at a higher frequency without a short of a current upon reversal.

However, in the first example of the driving apparatus, when a switch element is turned off (for example, FETs (field effect transistors) are used as the switch elements), since the junction capacitance in the drain-source path is present, and a stray capacitance is present near other components, an oscillation phenomenon of a current occurs due to these capacitances and the inductance of the main coil. For this reason, the current reversal time of the main coil largely depends on such transient characteristics, and the actual current reversal time is determined not by the switching time of the switch element itself but by the period of a current oscillation. Therefore, in order to make the period of the current oscillation shorter, for example, a switch element having a small junction capacitance may be selected, or the number of turns of the main coil may be decreased to decrease the inductance of the main coil. However, as the switch element has a smaller junction capacitance, the rated current becomes smaller, and when the inductance is decreased, a sufficient magnetic field strength cannot be obtained. Therefore, with this method, a certain limitation is imposed, and an increase in magnetic field reversal speed of the magnetic head is limited.

SUMMARY OF THE INVENTION

The present invention has been made in consideration of the above situation, and has as its object to provide a magnetic head driving apparatus, which can effectively shorten the magnetic field reversal time of a magnetic head, and can satisfactorily meet a high-speed magnetic field reversal requirement in pit edge recording.

In order to achieve the above object, according to the present invention, there is provided a magnetic head driving apparatus which comprises at least a pair of switch elements for switching a direction of a current to be supplied to a magnetic head, and controls ON/OFF operations of the pair of switch elements in correspondence with an information signal to be recorded so as to modulate a magnetic field generated by the magnetic head in accordance with the information signal, wherein a predetermined time difference is provided between an ON operation of one switch element and an OFF operation of the other switch element of the pair of switch elements.

In order to achieve the above object, according to the present invention, there is also provided a magnetic head driving apparatus which comprises a bridge circuit obtained by connecting a main coil for generating a magnetic field between connecting portions of a series circuit of a first auxiliary coil and a first switch element and a series circuit of a second auxiliary coil and a second switch element, and controls ON/OFF operations of the first and second switch elements in correspondence with information to be recorded so as to modulate a magnetic field to be generated by the magnetic head in accordance with the information signal, wherein third and fourth switch elements for separating current paths between the auxiliary coils and the main coil from each other are respectively connected in parallel with the first and second switch elements via rectifying elements each for preventing the reverse flow of a current from the main coil, and when the first and second switch elements are driven, the first and second switch elements are driven to have a predetermined time difference between ON and OFF operations thereof, or vice versa, respectively.

DESCRIPTION OF THE PREFERRED EMBODIMENTS

Figure 3:
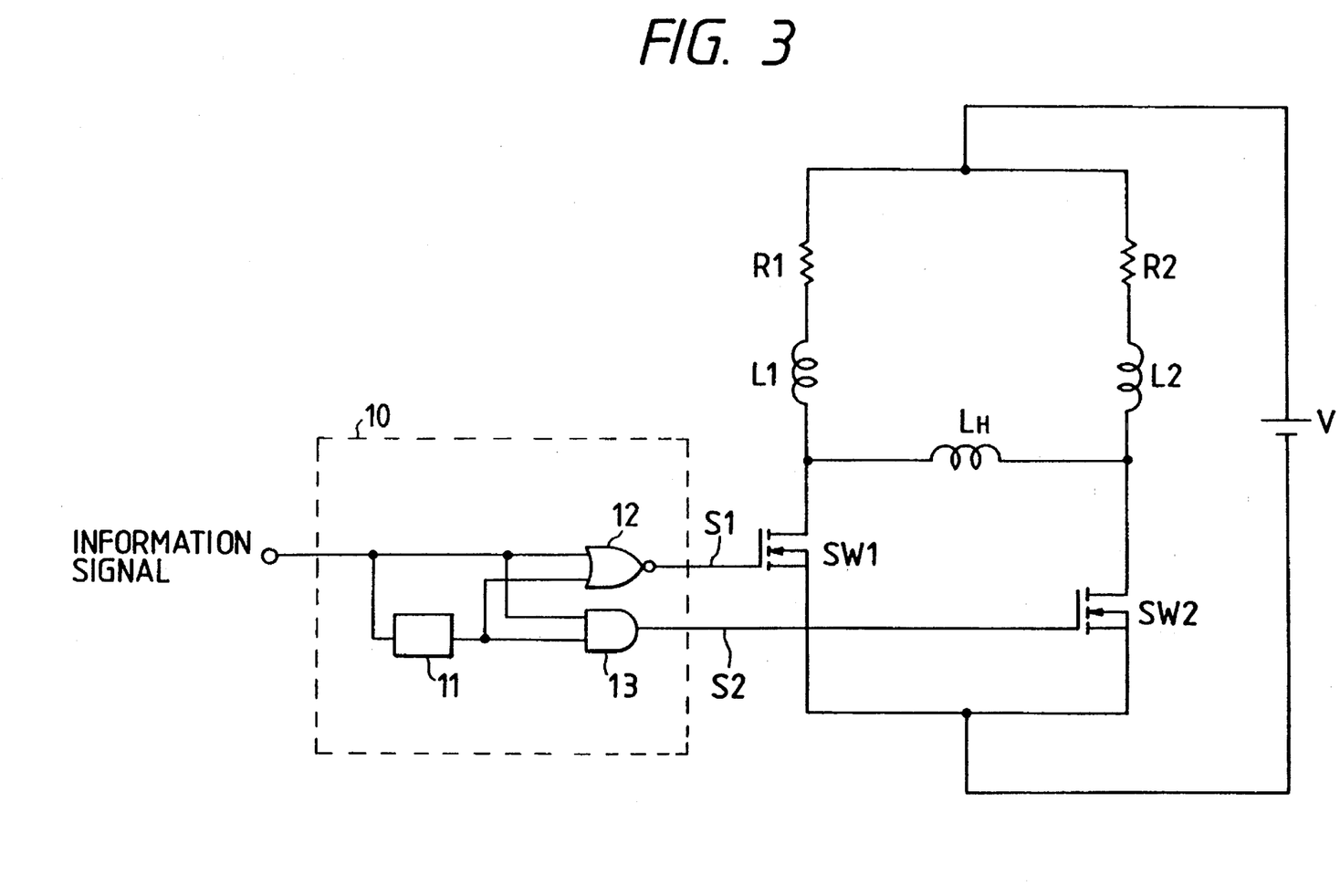
FIG. 3 is a circuit diagram showing an embodiment of a magnetic head driving apparatus according to the present invention.

The preferred embodiments of the present invention will be described below with reference to the accompanying drawings. FIG. 3 is a driving circuit diagram showing an embodiment of a magnetic head driving apparatus according to the present invention. The magnetic head driving apparatus of the present invention shown in FIG. 3 is used as the driving circuit 5 in the magnetooptical recording apparatus adopting the magnetic field modulation method shown in FIG. 1, and generates a magnetic field in a required direction in accordance with an information signal. Note that the same reference numerals in FIG. 3 denote the same parts in the conventional apparatus shown in FIG. 2. Referring to FIG. 3, the driving apparatus comprises a main coil $L_H$ for a magnetic head, which is wound around a magnetic core (not shown), auxiliary coils L1 and L2, and current limiting resistors R1 and R2 respectively connected in series with the auxiliary coils L1 and L2. The inductances of the auxiliary coils L1 and L2 are set to be sufficiently larger than that of the main coil $L_H$. The driving apparatus also comprises switch elements SW1 and SW2 which are respectively connected in series with the auxiliary coils L1 and L2, and these elements comprise MOSFETs in this embodiment. A gate driving circuit 10 drives the gates of the two switch elements SW1 and SW2. For this purpose, the gate driving circuit 10 generates gate driving signals for the switching elements SW1 and SW2 on the basis of an information signal supplied from a controller (not shown).

The gate driving circuit 10 comprises a delay element 11, a NOR gate 12, and an AND gate 13, and generates, by these logic circuits, driving signals having opposite phases, one of which is in phase with an information signal to be recorded, and applies the driving signals having opposite phases to the gates of the switch elements SW1 and SW2. In the gate driving circuit 10, since the NOR gate 12 and the AND gate 13 respectively calculate an OR and an AND with an information signal obtained via the delay element 11, a predetermined time difference is produced between the two gate driving signals having opposite phases. This time difference serves to shorten the magnetic field reversal time of the magnetic head. This effect will be described in detail later. Note that a DC power supply V supplies a driving current to the main coil $L_H$.

Figure 4A:
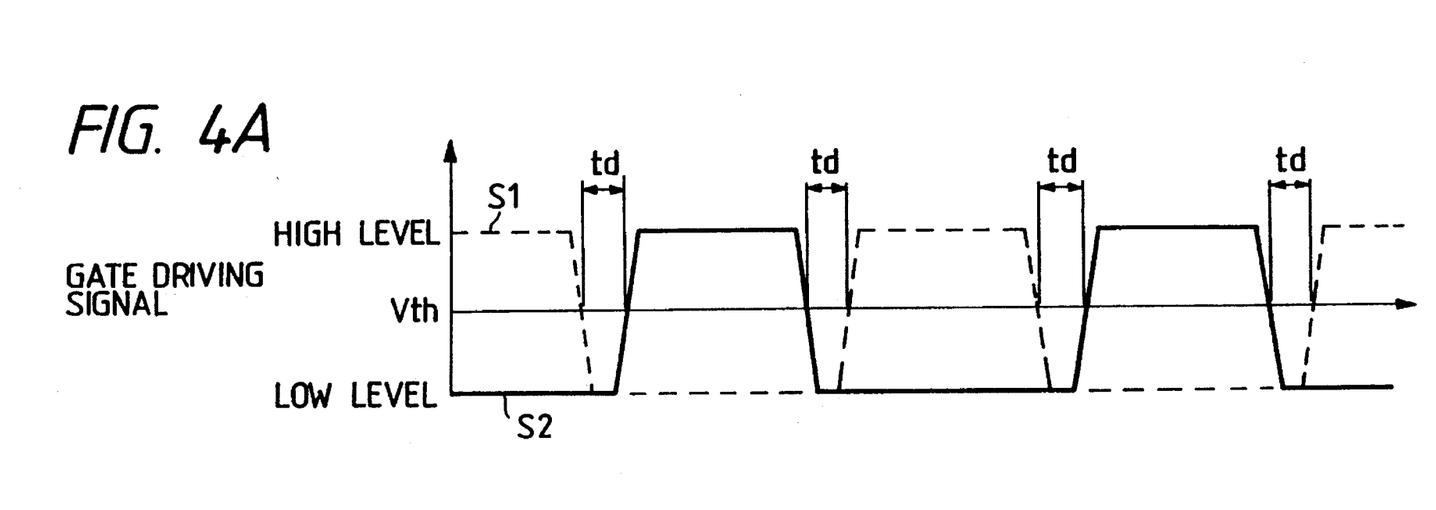
FIGS. 4A and 4B are timing charts showing an operation of the embodiment shown in FIG. 3.
Figure 4B:
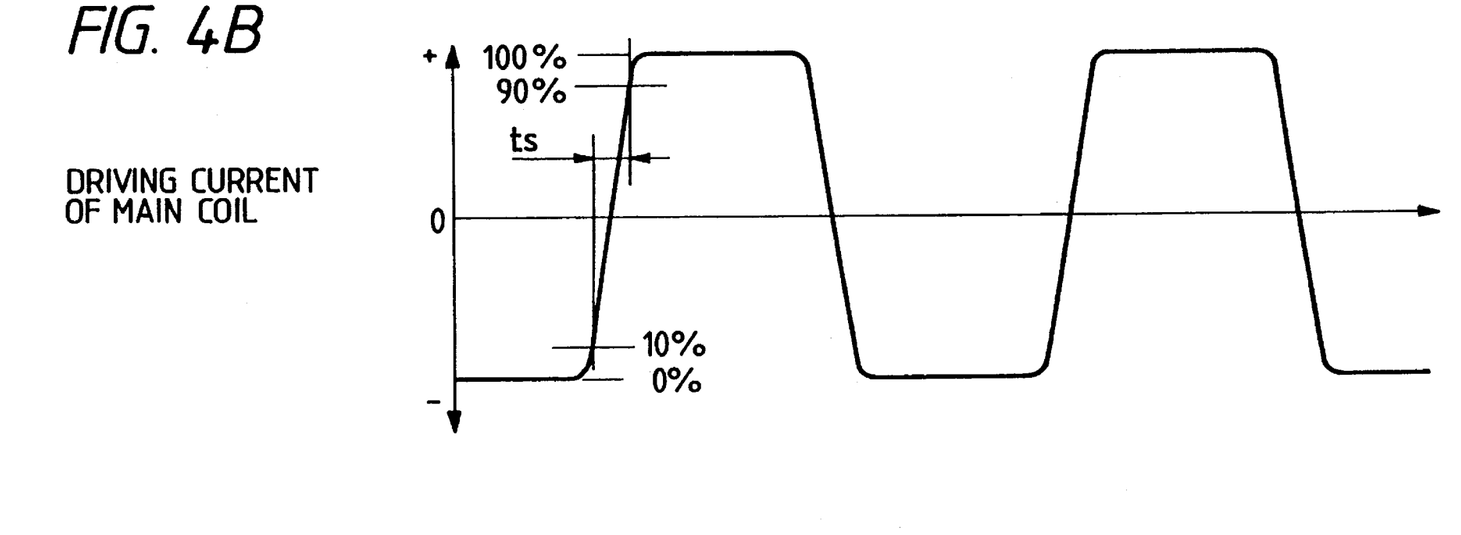

The operation of the above embodiment will be described in detail below with reference to FIGS. 4A and 4B. FIG. 4A shows gate driving signals S1 and S2 to be applied from the gate driving circuit 10 to the gates of the switch elements SW1 and SW2, and FIG. 4B shows a driving current supplied to the main coil $L_H$. When an information signal input to the gate driving circuit 10 is at low level, the NOR gate 12 applies a high-level gate driving signal S1 to the gate of the switch element SW1, and the AND gate 13 applies a low-level gate driving signal S2 to the gate of the switch element SW2. In FIG. 4A, the high-level gate driving signal applied to the switch element SW1 is indicated by a broken curve S1, and the low-level gate driving signal applied to the switch element SW2 is indicated by a solid curve S2. Therefore, in this state, the switch element SW1 is turned on, the switch element SW2 is turned off, and a driving current shown in FIG. 4B is supplied to the main coil $L_H$. Thus, the magnetic head generates a magnetic field corresponding to the direction of the driving current, and applies it to a magnetooptical disk.

When the information signal is inverted from low level to high level, the gate driving signal S1 is inverted to low level, as shown in FIG. 4A, and the other gate driving signal S2 goes to high level a predetermined period of time after the information signal is inverted to high level due to the delay effect of the delay element 11. More specifically, when the threshold voltage of the gate of each of the switch elements SW1 and SW2 is represented by $V_{th}$, a predetermined time difference is provided, so that a time difference between the threshold voltages $V_{th}$ of the gate driving signals S1 and S2 becomes $t_d$. Therefore, when the gate driving signal S1 is inverted from high level to low level, and reaches the threshold voltage $V_{th}$, the switch element SW1 is turned off. On the other hand, the other switch element SW2 is turned on when the gate driving signal S2 is inverted from low level to high level, and reaches the threshold voltage $V_{th}$. For this reason, the ON and OFF timings of the two switch elements SW1 and SW2 or vice versa are shifted by the predetermined time $t_d$. In this manner, when the switch element SW1 is turned off, and the switch element SW2 is turned on, a driving current in a direction opposite to the above-mentioned driving current is supplied to the main coil $L_H$, as shown in FIG. 4B, and the magnetic head generates a magnetic field in the opposite direction accordingly.

When the information signal is inverted from high level to low level again, the gate driving signal S2 is inverted to low level, and the gate driving signal S1 goes to high level after an elapse of a predetermined period of time due to the delay effect of the delay element 1. Therefore, at this time as well, the ON and OFF timings of the two switch elements SW1 and SW2 or vice versa have the time difference $t_d$ therebetween. Thereafter, the switch elements SW1 and SW2 are alternately turned on in accordance with an information signal, and the magnetic head generates a magnetic field modulated according to the information signal. In this embodiment, a current reversal time $t_s$ of the main coil $L_H$ is defined as a time in which the current changes from 10% to 90%, as shown in FIG. 4B.

Figure 5:
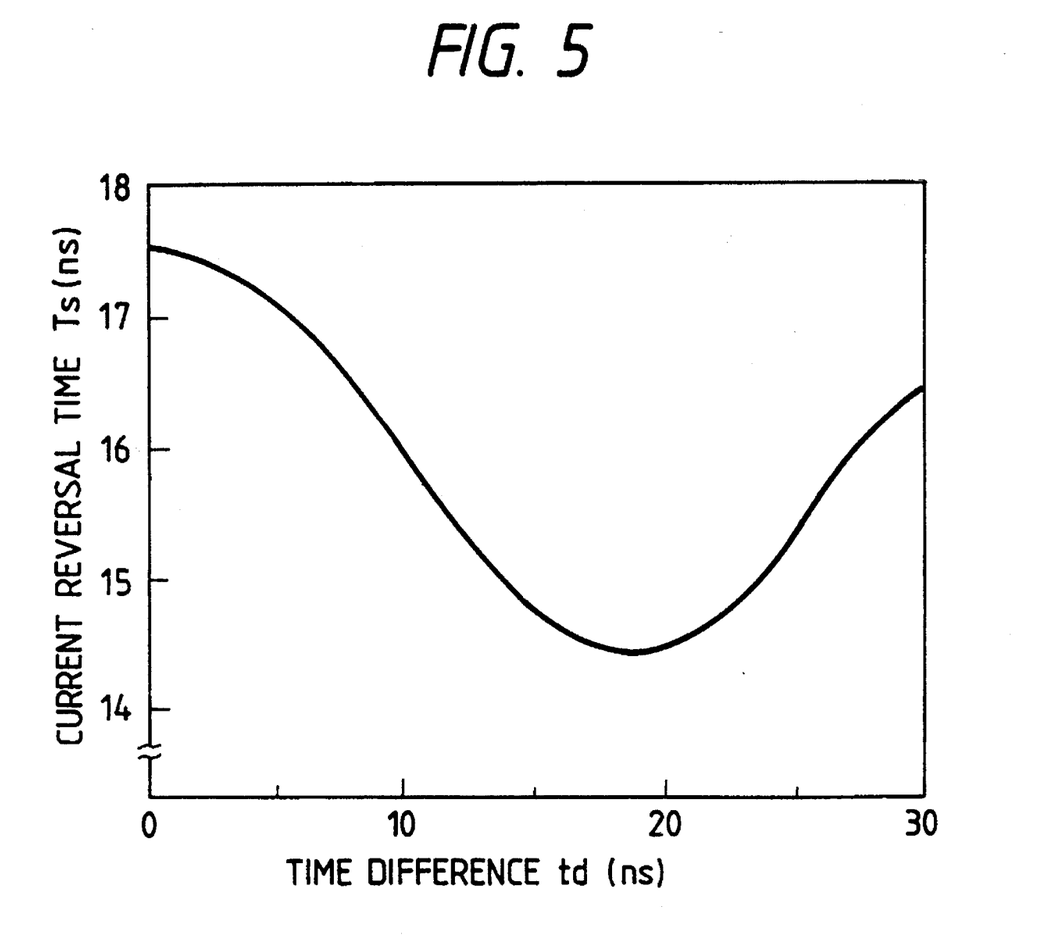
FIG. 5 is a graph showing the experimentally obtained relationship between the time difference between ON and OFF operations of two switch elements, respectively, and the current reversal time of a main coil.

The meaning of the above-mentioned time difference $t_d$ provided between the ON and OFF timings of the two switch elements will be described in detail below. FIG. 5 is a graph showing the measurement result of the dependency of the current reversal time $t_s$ obtained when the time difference $t_d$ is changed. More specifically, the present inventors paid attention to the relationship between the time difference between the ON and OFF timings of the switch elements and the transient characteristics upon reversal of the current of the main coil, and measured a change in current reversal time $t_s$ obtained when the time difference $t_d$ was changed. As can be seen from the experimental result in FIG. 5, it was confirmed that when a specific time difference $t_d$ was provided between the ON and OFF timings of the two switch elements, the current reversal time $t_s$ assumed a minimal value. In this case, it was found that when the time difference $t_d$ was about 19 ns, the current reversal time $t_s$ assumed a minimal value of about 14.5 ns. The effect of shortening the current reversal time by the time difference can be proved by the following theoretical basis.

As a known transient characteristic upon current reversal of the main coil $L_H$, a current oscillation occurs between the inductance of the main coil $L_H$ and a stray capacitance around the main coil $L_H$, in particular, the drain-source junction capacitance of the switch element which is turned off. Since such a current oscillation is a series oscillation of L and C where L is the inductance of the main coil $L_H$ and C is the stray capacitance around the main coil, its oscillation period $T_0$ is given by:

$$T_0 = 2\pi \sqrt{L \cdot C} \qquad (1)$$

Figure 9:
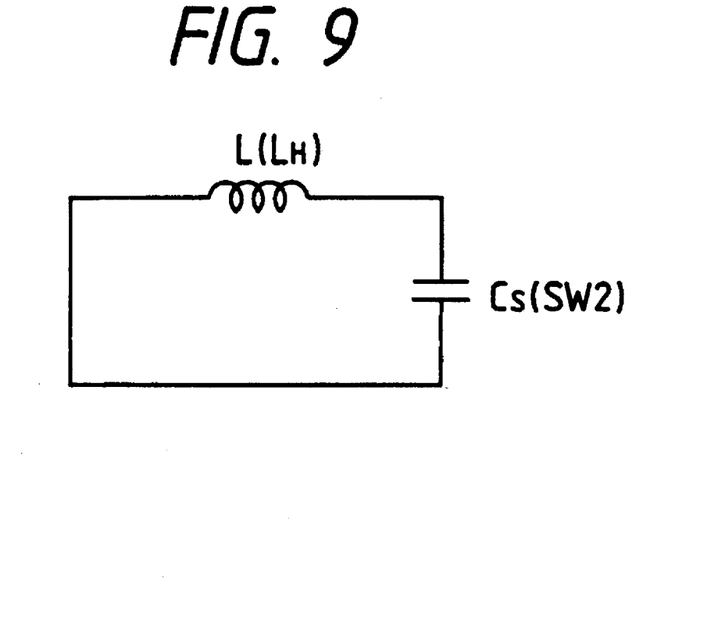
FIG. 9 is a circuit diagram showing an equivalent circuit upon current reversal in the case of not setting a time difference $t_d$.
Figure 10:
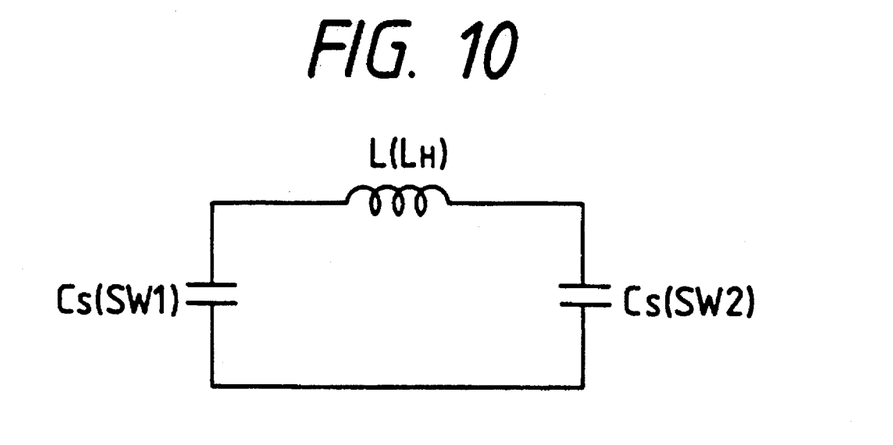
FIG. 10 is a circuit diagram showing an equivalent circuit upon current reversal in the case of setting the time difference $t_d$.

More specifically, current oscillation begins simultaneously with an OFF operation of one switch element, and after an elapse of a time $T_0/2$, the reversed current assumes a maximal value. If the time difference $t_d$ ($t_d=0$) is not set, the switch element SW1 is turned on, and the switch element SW2 is turned off at the same time. When $C_s$ is the junction capacitance of the switch element, current oscillation occurs in a series circuit of the inductance L and the capacitance $C_s$ equivalently shown in FIG. 9. If the time difference $t_d$ is set, both the switch elements SW1 and SW2 are OFF in the range of the time difference $t_d$. In this case, current oscillation occurs in a series circuit of the inductance L and the two capacitances $C_s$ equivalently shown in FIG. 10.

The stray capacitance C of the above-mentioned equation (1) includes the junction capacitances of the switch elements. Therefore, the stray capacitance C becomes smaller in the case of setting the time difference $t_d$ than in the case of not setting the time difference $t_d$. As a result, the oscillation period $T_o$ indicated by the above-mentioned equation (1) becomes smaller. This means that high-speed current reversal can be realized when the time difference $t_d$ is set.

On the other hand, when the time difference $t_d$ is set lager than $T_o/2$, current oscillation undesirably decreases because of passing an initial maximal peak. Thus, when the other switch element is turned on after an elapse of $T_0/2$, the reversal time $t_s$ of the driving current of the main coil $L_H$ can be minimized. More specifically, a condition for minimizing the current reversal time $t_s$ is $T_0/2$.

In practice, the experimental result shown in FIG. 5 was measured when the inductance of the main coil $L_H$ was set to be 1.5 μH and the stray capacitance C was 25 pF. At this time, the value of $T_0/2$ as a calculation result of equation (1) is 19 ns. In contrast to this, as can be seen from the experimental result in FIG. 5, since the time difference $t_d$ obtained when the current reversal time $t_s$ is minimized is about 19 ns, the calculation result agrees with the experimental result.

In this manner, according to this embodiment, since the time difference $t_d$ is provided between the ON and OFF timings of the two switch elements SW1 and SW2 or vice versa, the current reversal time of the main coil $L_H$ can be effectively shortened. In particular, when the time difference $t_d$ is set to be $T_0/2$ ($T_0=2\pi\sqrt{L \cdot C}$ where L is the inductance of the main coil $L_H$ and C is the stray capacitance around the main coil), the current reversal time $t_s$ of the main coil $L_H$ can be minimized. Therefore, the magnetic field reversal time of the magnetic head can be effectively shortened without decreasing the junction capacitance of the switch element or the inductance of the main coil, and a high-speed magnetic field reversal requirement in pit edge recording can be satisfactorily met.

In addition, according to this embodiment, since the auxiliary coils are provided, a current upon reversal does not run short, unlike in the above-mentioned second conventional apparatus, so that the above-mentioned characteristic which allows current reversal at high speed more effectively is enhanced.

Another embodiment of a magnetic head driving apparatus according to the present invention to be described below is used in the magnetooptical recording apparatus shown in FIG. 1 as in the first embodiment.

Figure 6:
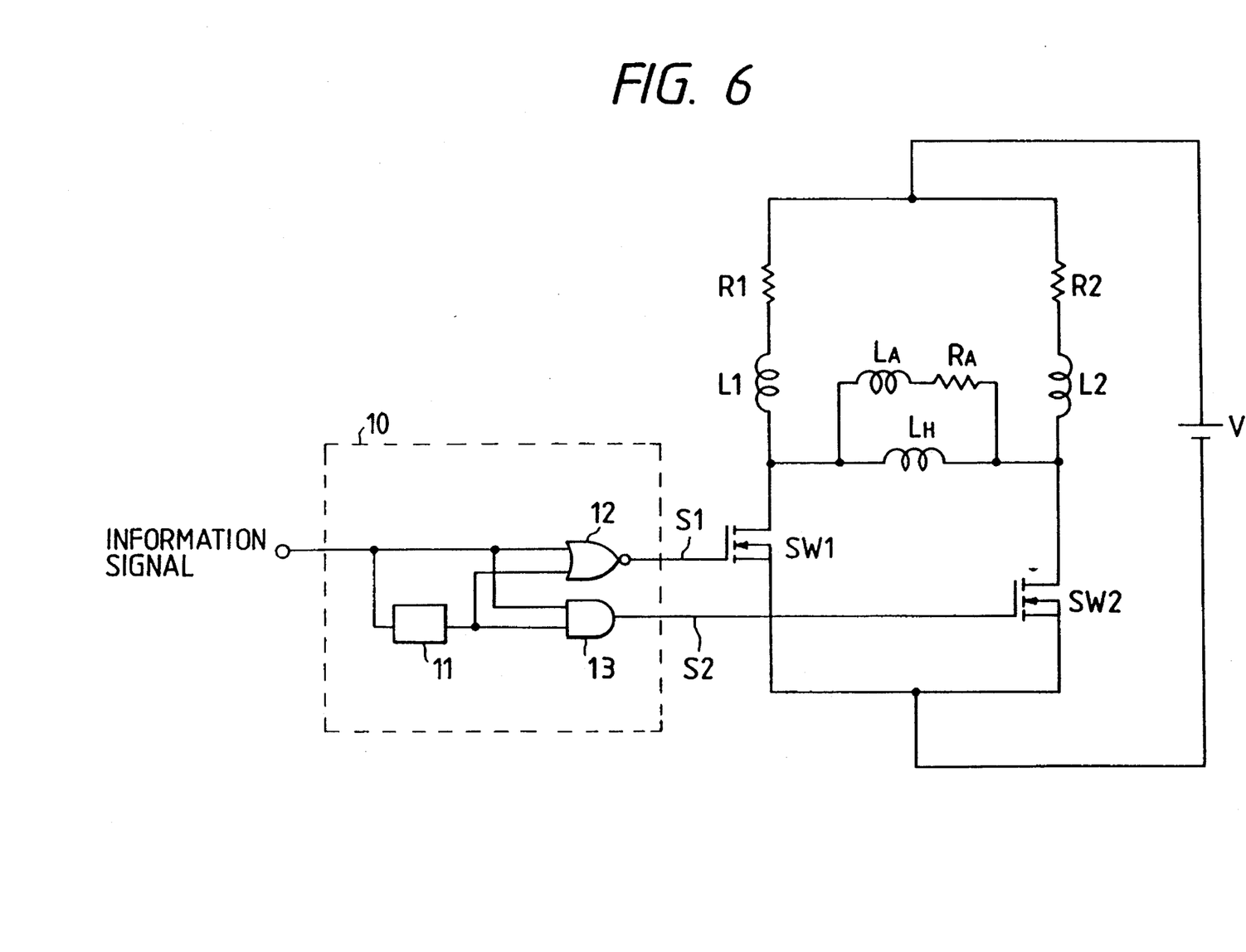
FIG. 6 is a circuit diagram showing another embodiment of the present invention.

FIG. 6 is a driving circuit diagram showing another embodiment of the present invention. In this embodiment, the present invention is applied to a magnetic head driving apparatus (Japanese Patent Application No. 4-83056) previously filed by the present inventors. In this application, the current reversal time of a main coil is shortened by connecting an acceleration coil in parallel with the main coil of a magnetic head. In this embodiment, a time difference is provided between the ON and OFF timings of switch elements, thereby further shortening the current reversal time. Referring to FIG. 6, an acceleration coil $L_A$ is connected in parallel with the main coil $L_H$, and a resistor $R_A$ is connected in series with the acceleration coil $L_A$. The acceleration coil $L_A$ operates to decrease the inductance of the main coil $L_H$ at a frequency associated with current reversal of the main coil $L_H$, thereby shortening the current reversal time of the main coil. The resistor $R_A$ is used for suppressing a current flowing into the acceleration coil $L_A$ at the frequency of an information signal. Other arrangements are the same as those in the embodiment shown in FIG. 3. That is, the gate driving circuit 10 generates gate driving signals S1 and S2 for producing a time difference $t_d$ between the ON and OFF timings of the switch elements Sw1 and SW2 or vice versa, and these signals are applied to the gates of the switch elements SW1 and SW2.

When such an acceleration coil $L_A$ is arranged, the transient characteristic upon current reversal of the main coil $L_H$ is a current oscillation caused by a synthetic inductance of the main coil $L_H$ and the acceleration coil $L_A$, and a stray capacitance around the main coil $L_H$. If the synthetic inductance of the main coil $L_H$ and the acceleration coil $L_A$ is represented by L', and the stray capacitance around the main coil $L_H$ is represented by C, an oscillation period $T_0'$ of the current oscillation is given by:

$$T_0' = 2\pi\sqrt{L' \cdot C} \qquad (2)$$

In this case, since the synthetic inductance L' of the main coil $L_H$ and the acceleration coil $L_A$, and the inductance L of the main coil $L_H$ satisfy L'<L, the oscillation period $T_0'$ becomes shorter than the oscillation period $T_0$ without the acceleration coil $L_A$, and these periods satisfy $T_0'<T_0$ ($T_0=2\pi\sqrt{L \cdot C}$). Therefore, when the time difference $t_d$ between the ON and OFF timings of the switch elements SW1 and SW2 or vice versa is set to be $T_0'/2$, the current reversal time $t_s$ of the main coil $L_H$ can be minimized.

In this embodiment, since the acceleration coil $L_A$ is connected in parallel with the main coil $L_H$, and a time difference is provided between the ON and OFF timings of the two switch elements, the effect of shortening the current reversal time by the time difference can be obtained in addition to the effect of shortening the current reversal time by the acceleration coil $L_A$. Therefore, as compared to the embodiment shown in FIG. 3, the current reversal time of the main coil can be further shortened, and a high-speed magnetic head driving apparatus which can meet a high-speed magnetic field reversal requirement in pit edge recording can be provided.

Figure 7:
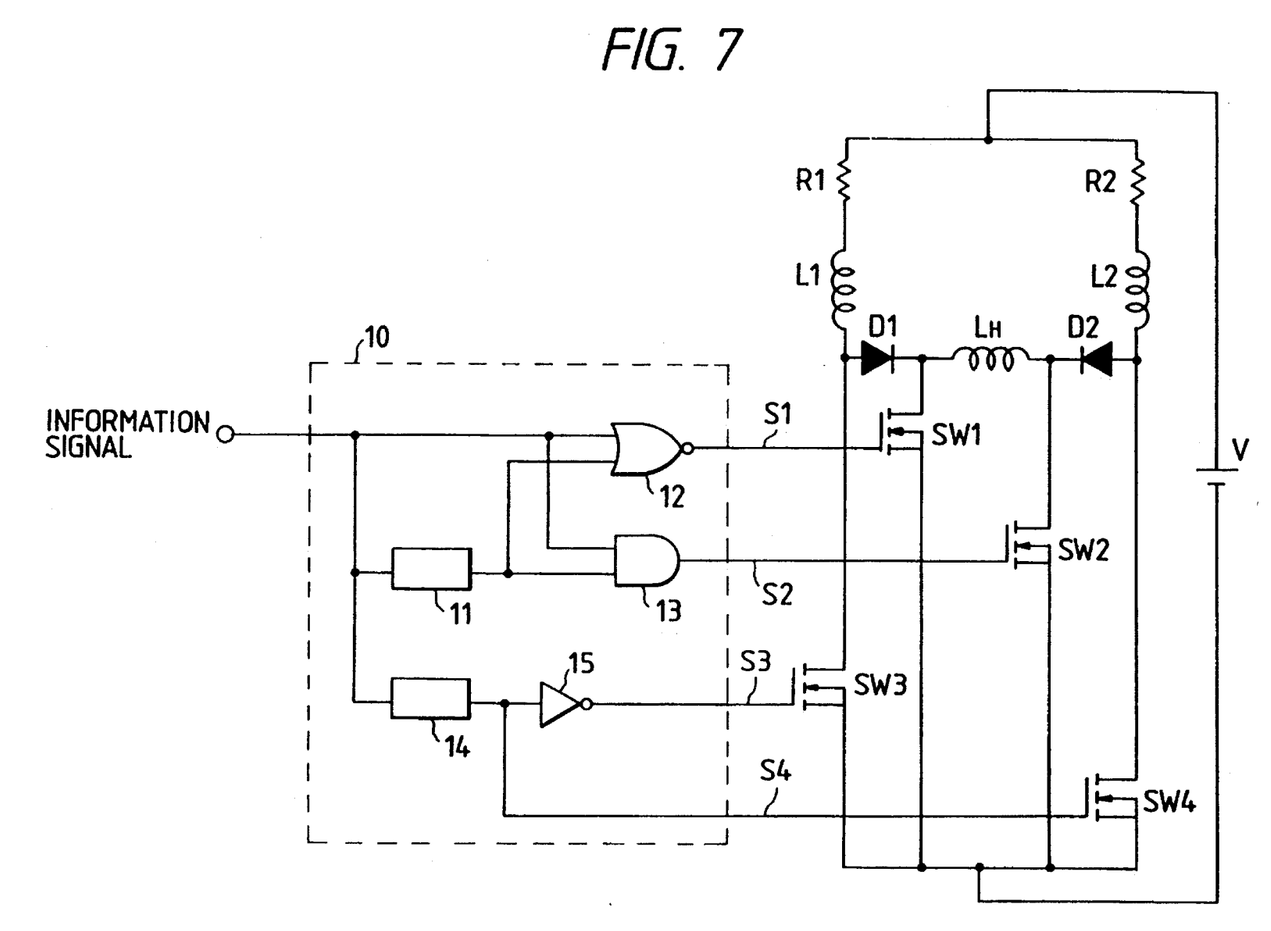
FIG. 7 is a circuit diagram showing still another embodiment of the present invention.

FIG. 7 is a circuit diagram showing still another embodiment of the present invention. In this embodiment, a time difference between the ON and OFF timings of the switch elements is further provided to a magnetic head driving apparatus (Japanese Patent Application No. 3-311368) previously filed by the present inventors. The same reference numerals in FIG. 7 denote the same parts as in the embodiment shown in FIG. 3. Referring to FIG. 7, diodes D1 and D2 are connected respectively between the auxiliary coil L1 and the main coil $L_H$, and between the auxiliary coil L2 and the main coil $L_H$. Switch elements SW1 and SW2 are connected between nodes between the cathodes of the diodes D1 and D2 and the main coil $L_H$, and ground, and switch elements SW3 and SW4 are connected between nodes between the anodes of the diodes D1 and D2 and the auxiliary coils L1 and L2, and ground. The switch elements SW1 and SW3, and the switch elements SW2 and SW4 are driven as pairs of elements, and when the switch elements SW2 and SW4 are turned on, and the switch elements SW1 and SW3 are turned off, a driving current is supplied to the main coil $L_H$ via a current path of the auxiliary coil L1, the main coil $L_H$, and the switch element SW2. At this time, almost the same current as that supplied to the main coil $L_H$ is supplied to the auxiliary coil L2 via the switch element SW4, i.e., via a path different from the current path to the main coil $L_H$. More specifically, the current path of the main coil $L_H$ and that of the auxiliary coil L2 are separated from each other by the diode D2, and currents are supplied via different paths.

On the other hand, when the switch elements SW1 and SW3 are turned on, and the switch elements SW2 and SW4 are turned off, a driving current in a direction opposite to the above-mentioned driving current is supplied to the main coil $L_H$ via a path of the auxiliary coil L2, the main coil $L_H$, and the switch element SW1. Also, a current is supplied to the auxiliary element L1 via the switch element SW3. At this time as well, the current path of the auxiliary coil L1 is separated from that of the main coil $L_H$ by the diode D1. As the switch elements SW1 to SW4, field effect transistors are used.

The gate driving circuit 10 comprises the delay element 11, the NOR gate 12, and the AND gate 12, as in the embodiment shown in FIG. 3, and output signals from the NOR gate 12 and the AND gate 13 are supplied to the gates of the switch elements SW1 and SW2 as gate driving signals S1 and S2. Therefore, a predetermined time difference is provided between the ON and OFF timings of the switch elements SW1 and SW2 or vice versa, and the current reversal time of the main coil $L_H$ is shortened as in the embodiment shown in FIG. 3. The gate driving circuit 10 also comprises a delay element 14 and an inverting gate 15. An output signal from the inverting gate 15 is input to the gate of the switch element SW3 as a gate driving signal S3, and an output signal from the delay element 14 is input to the gate of the switch element SW4 as a gate driving signal S4. With these signals, the switch elements SW3 and SW4 are respectively turned off a predetermined delay time after OFF operations of the switch elements SW1 and SW2.

Figure 8A:
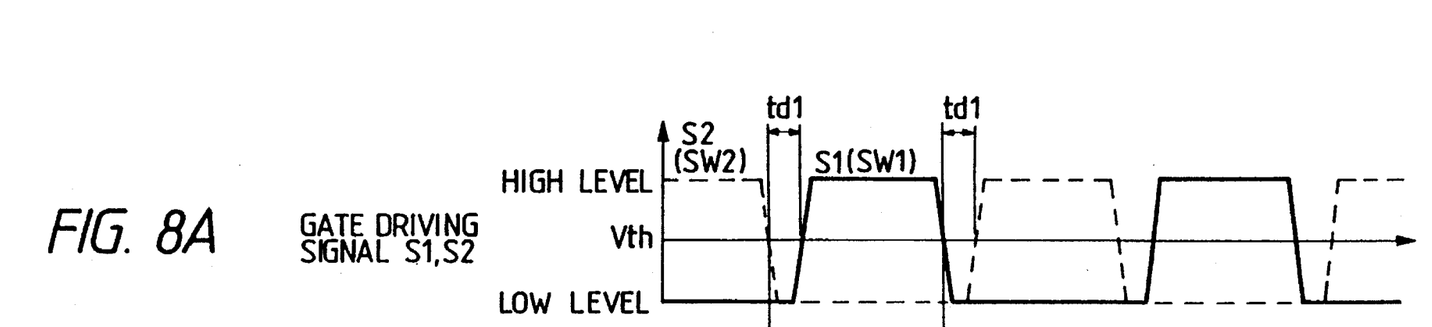
FIGS. 8A to 8C are timing charts showing the operation of the embodiment shown in FIG. 7.
Figure 8B:
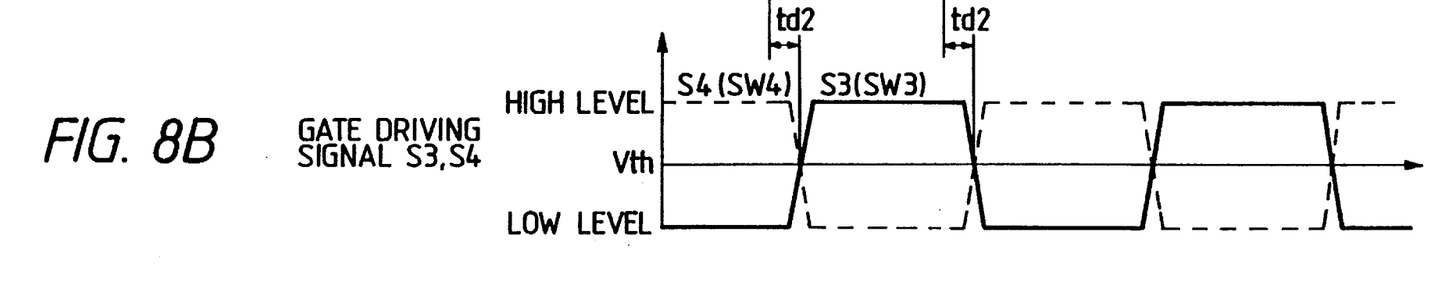
Figure 8C:
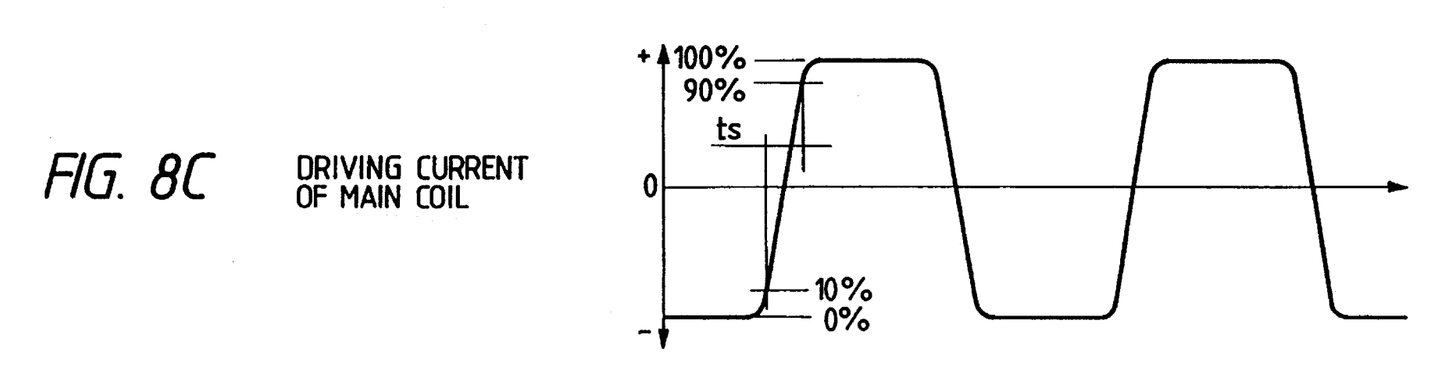

FIGS. 8A to 8C show signals of the respective units in the embodiment shown in FIG. 7. FIG. 8A shows the gate driving signals S1 and S2 of the switch elements SW1 and SW2, FIG. 8B shows the gate driving signals S3 and S4 of the switch elements SW3 and SW4, and FIG. 8C shows a driving current of the main coil $L_H$. Upon reception of an information signal, the gate driving circuit 10 generates the gate driving signals S1 and S2, as shown in FIG. 8A, and applies these signals to the gates of the switch elements SW1 and SW2. A time difference between the threshold voltages $V_{th}$ of the gate driving signals S1 and S2 is set to be $t_{d1}$, so that a time $t_{d1}$ is produced between the ON and OFF timings of the two switch elements S1 and S2 or vice versa as in the embodiment shown in FIG. 3. The time difference $t_{d1}$ at this time is set to be ½ of a period $T_0$ ($T_0 = 2\pi\sqrt{L \cdot C}$ where L is the inductance of the main coil and C is the stray capacitance around the magnetic head) of a current oscillation caused by the inductance and the stray capacitance.

Also, the gate driving circuit 10 generates the gate driving signals S3 and S4 delayed by a time $t_{d2}$ from the gate driving signals S1 and S2, respectively, as shown in FIG. 8B, and applies these signals to the gates of the switch elements SW3 and SW4. Therefore, when the switch elements SW1 and SW2 are turned off, the switch elements SW3 and SW4 are turned off the predetermined time $t_{d2}$ after the OFF operations of the switch elements SW1 and SW2. When the switch elements in the respective pairs are turned off in this manner, the switch elements SW3 and SW4 for driving the auxiliary coils are turned off the delay time $t_{d2}$ after the OFF operations of the switch elements SW1 and SW2 for driving the main coil. As will be described in detail later, this operation functions to increase the driving frequency of the magnetic head. As described above, when the switch elements SW1 and SW3 are turned on, a driving current shown in FIG. 8C is supplied to the main coil $L_H$ via the current path of the switch element SW1, and a current from the auxiliary coil L1 is supplied to the switch element SW3. When the switch elements SW2 and SW4 are turned on, a driving current having a reversed current direction, as shown in FIG. 8C, is similarly supplied to the main coil $L_H$, and a current from the auxiliary coil L2 is supplied to the switch element SW4. In this manner, the switch elements SW1 and SW3, and the switch elements SW2 and SW4 are alternately turned on in accordance with an information signal, and a magnetic field generated by the magnetic head is modulated according to the information signal.

In this embodiment, since a current to the main coil and a current to the auxiliary coil flow through separate current paths, the current supplied to each switch element can be halved as compared to a conventional element, and a switch element having a smaller current capacity accordingly can be used. This leads to an effect of shortening the current reversal time of the main coil since the stray capacitance of the switch element (i.e., if the switch element is a field effect transistor, the source-drain capacitance) is decreased. If the diodes D1 and D2 are omitted, since the two switch elements are connected in parallel with each other, the stray capacitance is doubled, and the reversal time of the current supplied to the main coil $L_H$ is prolonged. However, since the diodes D1 and D2 are connected between the switch elements SW1 and SW3 and between the switch elements SW2 and SW4, the influence of the capacitances of the newly added switch elements SW3 and SW4 can be eliminated if the diodes having small capacitances are used, and the reversal time of the current to the main coil $L_H$ is never prolonged. In this manner, according to this embodiment, since the current paths of the main coil and the auxiliary coil are separated from each other, the current to each switch element can be halved, and hence, the current reversal time of the main coil can be shortened. Also, since a predetermined time difference is provided between the ON and OFF timings of the two switch elements, the current reversal time of the main coil can be further shortened.

Furthermore, in this embodiment, since the switch element SW4 is controlled to be turned off a predetermined delay time $t_{d2}$ after the OFF operation of the switch element SW2, and the switch element SW3 is controlled to be turned off the predetermined delay time $t_{d2}$ after the OFF operation of the switch element SW1, the driving frequency of the magnetic head can be greatly increased as compared to a conventional apparatus. More specifically, in a conventional apparatus, when a switch element is turned off, a current oscillation phenomenon occurs due to the inductance of the main coil and the capacitance of the switch element. In this OFF operation, a required current is instantaneously supplied from the auxiliary coil to the main coil. At this time, a current is concentrated on the main coil, and consequently, energy ($\frac{1}{2}LI^2$) originally held by the main coil as a source of the current oscillation phenomenon becomes excessive. Therefore, in order to quickly attenuate the oscillation, excessive energy must be consumed by a resistor or the like, while a decrease in energy of the auxiliary coil must be compensated for before the next current reversal. Thus, in this embodiment, the OFF timings of the switch elements are controlled, so that the switch element SW3 is turned off after the switch element SW1 is turned off, and the switch element SW4 is turned off after the switch element SW2 is turned off, and current supply from the auxiliary coil to the main coil is delayed, thereby greatly reducing the amplitude of the current oscillation as compared to the conventional apparatus, and eliminating generation of excessive energy of the main coil. It is desirable that the delay time $t_{d2}$ between the switch elements SW1 and SW3 and between the switch elements SW2 and SW4 be about ½ of the oscillation period at which the reversed current is maximized.

When the present inventors conducted experiments under this delay time condition, it was confirmed that the current oscillation became ⅓ or less as compared to the conventional apparatus. In practice, in order to quickly attenuate a current oscillation, excessive energy is consumed by, e.g., a resistor, and equivalent energy is supplied to the auxiliary coil before the next current reversal. As described above, since energy consumption upon current reversal of the main coil is decreased by shifting the OFF timings of the respective pairs of switch elements, the current to the main current never becomes short, and the main coil can be driven at a higher driving frequency. According to the experiments of the present inventors, when the voltage of the DC power supply was set to be 5 V, the inductance of the main coil was set to be 1 μH, and the current to the main coil was set to be 0.2 A, the upper limit of the driving frequency was 10 MHz. Thus, it was confirmed that the driving frequency could be greatly increased as compared to the upper limit (5 MHz) of the conventional driving frequency.

In the embodiment described with reference to FIG. 7, in a magnetic head driving apparatus which comprises a bridge circuit obtained by connecting a main coil for generating a magnetic field between connecting portions of a series circuit of a first auxiliary coil and a first switch element and a series circuit of a second auxiliary coil and a second switch element, and controls ON/OFF operations of the first and second switch elements in correspondence with information to be recorded so as to modulate a magnetic field to be generated by the magnetic head in accordance with the information signal, third and fourth switch elements for separating current paths between the auxiliary coils and the main coil from each other are respectively connected in parallel with the first and second switch elements via rectifying elements each for preventing the reverse flow of a current from the main coil, and when the first and second switch elements are driven, the first and second switch elements are driven to have a predetermined time difference between ON and OFF operations thereof, or vice versa, respectively.

The time difference is set to be about ½ of a period $T_O$ ($T_0=2\pi\sqrt{L \cdot C}$ where L is the inductance of the main coil of the magnetic head, and C is the stray capacitance around the magnetic head) of a current oscillation caused by the inductance and the stray capacitance.

The third and fourth switch elements are controlled to be turned off a predetermined delay time after the first and second switch elements, respectively.

As described above, according to the present invention, when a pair of switch elements are driven to have a predetermined time difference between ON and OFF operations thereof, respectively, the reversal time of the driving current of the magnetic head can be effectively shortened, and the magnetic field reversal time of the magnetic head can be greatly shortened as compared to the conventional apparatus. Therefore, a high-speed magnetic field reversal requirement in pit edge recording can be satisfactorily met, and the present invention greatly contributes to high-density recording of information based on pit edge recording. In addition, since the current paths of the main coil and the auxiliary coil are separated from each other, and the switch elements are driven to have a time difference between their ON and OFF timings, the current reversal time of the magnetic head can be further shortened.

What is claimed is:

1. A magnetic head driving apparatus comprising:

a first auxiliary coil;

a first switch element connected in series with said first auxiliary coil;

a second auxiliary coil;

a second switch element connected in series with said second auxiliary coil;

a main coil for generating a magnetic field, said main coil being connected between a node between said first auxiliary coil and said first switch element, and a node between said second auxiliary coil and said second switch element; and control means for controlling switching operations of said first and second switch elements to change a direction of current supplied to said main coil, said control means causing said first and second switch elements to alternate being in an ON state and causing a predetermined time difference between a point in time at which said first switch element is switched from the ON state to an OFF state and a point in time at which said second switch element is switched from the OFF state to the ON state, using a delay element.

2. An apparatus according to claim 1, wherein said magnetic head driving apparatus is used in a magnetooptical recording apparatus.

3. An apparatus according to claim 1, wherein the time difference is set to be ½ of a period $T_0$, $T_0=2\pi\sqrt{L \cdot C}$ where L is the inductance of said main coil for generating the magnetic field, and C is the stray capacitance around said main coil, of a current oscillation caused by the inductance and the stray capacitance.

4. An apparatus according to claim 1, further comprising an acceleration coil connected in parallel with said main coil.

5. An apparatus according to claim 4, wherein the time difference is set to be ½ of a period $T_0'$, $T_O'=2\pi\sqrt{L' \cdot C}$ where L' is the synthetic inductance of said main coil and said acceleration coil, and C is the stray capacitance around said main coil, of a current oscillation caused by the synthetic inductance and the stray capacitance.

6. A magneto-optical recording apparatus comprising:

an optical head for irradiating a light beam to a magneto-optical recording medium; and a magnetic head for applying a magnetic field to the magneto-optical recording medium, said magnetic head comprising:

(i) a magnetic core;

(ii) a first auxiliary coil;

(iii) a first switch element connected in series with said first auxiliary coil;

(iv) a second auxiliary coil;

(v) a second switch element connected in series with said second auxiliary coil;

(vi) a main coil for generating a magnetic field, said main coil being wound around said magnetic core and connected between a node between said first auxiliary coil and said first switch element, and a node between said second auxiliary coil and said second switch element; and (vii) control means for controlling switching operations of said first and second switch elements to change a direction of current supplied to said main coil, said control means causing said first and second switch elements to alternate being in an ON state and causing a predetermined time difference between a point in time at which said first switch element is switched from the ON state to an OFF state and a point in time at which said second switch element is switched from the OFF state to the ON state, using a delay element.

7. An apparatus according to claim 6, wherein the time difference is set to be ½ of a period $T_0$, $T_0=2\pi\sqrt{L \cdot C}$ where L is the inductance of said main coil for generating the magnetic field, and C is the stray capacitance around said main coil, of a current oscillation caused by the inductance and the stray capacitance.

8. An apparatus according to claim 6, further comprising an acceleration coil connected in parallel with said main coil.

9. An apparatus according to claim 8, wherein the time difference is set to be ½ of a period $T_0'$, $T_0'=2\pi\sqrt{L' \cdot C}$ where L' is the synthetic inductance of said main coil and said acceleration coil, and C is the stray capacitance around said main coil, of a current oscillation caused by the synthetic inductance and the stray capacitance.

10. A magnetic head driving apparatus comprising:

a first auxiliary coil;

a first switch element connected in series with said first auxiliary coil;

a second auxiliary coil;

a second switch element connected in series with said second auxiliary coil;

a main coil for generating a magnetic field, said main coil being connected between a node between said first auxiliary coil and said first switch element, and a node between said second auxiliary coil and said second switch element; and control means for controlling switching operations of said first and second switch elements to cause said first and second switch elements to alternate being in an ON state and to cause a predetermined time difference between a point in time at which one of said first and second switch elements is switched from the ON state to an OFF state and a point in time at which an opposite one of said first and second switch elements is switched from the OFF state to the ON state, wherein the time difference is set to be ½ of a period $T_0$, $T_0=2\pi\sqrt{L \cdot C}$ where L is the inductance of said main coil for generating the magnetic field, and C is the stray capacitance around said main coil, of a current oscillation caused by the inductance and the stray capacitance.

11. An apparatus according to claim 10, wherein said magnetic head driving apparatus is used in a magnetooptical recording apparatus.

12. An apparatus according to claim 10, further comprising an acceleration coil connected in parallel with said main coil.

13. A magnetic head driving apparatus comprising:

a first auxiliary coil;

a first switch element connected in series with said first auxiliary coil;

a second auxiliary coil;

a second switch element connected in series with said second auxiliary coil;

a main coil for generating a magnetic field, said main coil being connected between a node between said first auxiliary coil and said first switch element, and a node between said second auxiliary coil and said second switch element; and control means for controlling switching operations of said first and second switch elements to cause said first and second switch elements to alternate being in an ON state and to cause a predetermined time difference between a point in time at which one of said first and second switch elements is switched from the ON state to an OFF state and a point in time at which an opposite one of said first and second switch elements is switched from the OFF state to the ON state, wherein the time difference is set to be ½ of a period $T_0'$, $T_0'=2\pi\sqrt{L' \cdot C}$ where L' is the synthetic inductance of said main coil and an acceleration coil, and C is the stray capacitance around said main coil, of a current oscillation caused by the synthetic inductance and the stray capacitance.

14. An apparatus according to claim 13, wherein said magnetic head driving apparatus is used in a magnetooptical recording apparatus.

15. An apparatus according to claim 13, further comprising an acceleration coil connected in parallel with said main coil.

16. A magneto-optical recording apparatus comprising:

an optical head for irradiating a light beam to a magneto-optical recording medium; and a magnetic head for applying a magnetic field to the magneto-optical recording medium, said magnetic head comprising:

(i) a magnetic core;

(ii) a first auxiliary coil;

(iii) a first switch element connected in series with said first auxiliary coil;

(iv) a second auxiliary coil;

(v) a second switch element connected in series with said second auxiliary coil;

(vi) a main coil for generating a magnetic field, said main coil being wound around said magnetic core and connected between a node between said first auxiliary coil and said first switch element, and a node between said second auxiliary coil and said second switch element; and (vii) control means for controlling switching operations of said first and second switch elements to cause said first and second switch elements to alternate being in an ON state and to cause a predetermined time difference between a point in time at which one of said first and second switch elements is switched from the ON state to an OFF state and a point in time at which an opposite one of said first and second switch elements is switched from the OFF state to the ON state, wherein the time difference is set to be ½ of a period $T_0$, $T_O=2\pi\sqrt{L \cdot C}$ where L is the inductance of said main coil for generating the magnetic field, and C is the stray capacitance around said main coil, of a current oscillation caused by the inductance and the stray capacitance.

17. An apparatus according to claim 16, further comprising an acceleration coil connected in parallel with said main coil.

18. A magneto-optical recording apparatus comprising:

an optical head for irradiating a light beam to a magneto-optical recording medium; and a magnetic head for applying a magnetic field to the magneto-optical recording medium, said magnetic head comprising:

(i) a magnetic core;

(ii) a first auxiliary coil;

(iii) a first switch element connected in series with said first auxiliary coil;

(iv) a second auxiliary coil;

(v) a second switch element connected in series with said second auxiliary coil;

(vi) a main coil for generating a magnetic field, said main coil being wound around said magnetic core and connected between a node between said first auxiliary coil and said first switch element, and a node between said second auxiliary coil and said second switch element; and (vii) control means for controlling switching operations of said first and second switch elements to cause said first and second switch elements to alternate being in an ON state and to cause a predetermined time difference between a point in time at which one of said first and second switch elements is switched from the ON state to an OFF state and a point in time at which an opposite one of said first and second switch elements is switched from the OFF state to the ON state, wherein the time difference is set to be ½ of a period $T_0'$, $T_0'=2\pi\sqrt{L'\cdot C}$ where $L'$ is the synthetic inductance of said main coil and an acceleration coil, and C is the stray capacitance around said main coil, of a current oscillation caused by the synthetic inductance and the stray capacitance.

19. An apparatus according to claim 18, further comprising an acceleration coil connected in parallel with said main coil.

* * * * *